(12) United States Patent
Kawahara et al.

(10) Patent No.: US 10,147,983 B2
(45) Date of Patent: Dec. 4, 2018

(54) SECONDARY BATTERY SYSTEM

(71) Applicant: Hitachi Automotive Systems. Ltd., Hitachinaka-shi, Ibaraki (JP)

(72) Inventors: Youhei Kawahara, Tokyo (JP); Takeshi Inoue, Tokyo (JP); Mutsumi Kikuchi, Hitachinaka (JP); Keiichiro Ohkawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 78 days.

(21) Appl. No.: 15/116,703

(22) PCT Filed: Jan. 21, 2015

(86) PCT No.: PCT/JP2015/051436
§ 371 (c)(1),
(2) Date: Aug. 4, 2016

(87) PCT Pub. No.: WO2015/125537
PCT Pub. Date: Aug. 27, 2015

(65) Prior Publication Data
US 2016/0351976 A1   Dec. 1, 2016

(30) Foreign Application Priority Data
Feb. 24, 2014   (JP) .................................. 2014-032903

(51) Int. Cl.
| | | |
|---|---|---|
| H01M 10/48 | (2006.01) |
| H02J 7/00 | (2006.01) |
| G01R 31/36 | (2006.01) |
| B60K 6/28 | (2007.10) |
| B60L 11/18 | (2006.01) |

(52) U.S. Cl.
CPC ............. *H01M 10/482* (2013.01); *B60K 6/28* (2013.01); *B60L 11/1803* (2013.01);
(Continued)

(58) Field of Classification Search
CPC ........................... H01M 10/482; H02J 7/0014
(Continued)

(56) References Cited

U.S. PATENT DOCUMENTS

| 8,340,932 B2 * | 12/2012 | Ichikawa | G01R 31/361 702/63 |
| 8,466,708 B2 * | 6/2013 | Kawahara | G01R 31/361 320/132 |

(Continued)

FOREIGN PATENT DOCUMENTS

| JP | 2003-148458 A | 5/2003 |
| JP | 2004-236381 A | 8/2004 |

(Continued)

OTHER PUBLICATIONS

International Search Report (PCT/ISA/210) issued in PCT Application No. PCT/JP2015/051436 dated Apr. 28, 2015, with English translation (two (2) pages).

(Continued)

*Primary Examiner* — Samuel Berhanu
*Assistant Examiner* — Tessema Kebede
(74) *Attorney, Agent, or Firm* — Crowell & Moring LLP

(57) ABSTRACT

A secondary battery system capable of acquiring an SOC of a battery with a simple computation without acquiring battery characteristics is to be provided. The secondary battery system according to the present invention is adapted to acquire a momentary SOC (charging SOC) by obtaining an initial value of an SOC from a CCV acquired during a charging period and adding an integrated value of a charge or discharge current to the initial value of the SOC, acquire a momentary SOC (discharging SOC) by obtaining an initial value of an SOC from a CCV acquired during a discharging period and adding an integrated value of a charge or dis- (Continued)

charge current to the initial value of the SOC, and acquire an SOC close to a true value by averaging the charging SOC and the discharging SOC.

8 Claims, 14 Drawing Sheets

(52) U.S. Cl.
CPC ....... *B60L 11/1824* (2013.01); *B60L 11/1861* (2013.01); *G01R 31/361* (2013.01); *G01R 31/3624* (2013.01); *G01R 31/3648* (2013.01); *H01M 10/48* (2013.01); *H02J 7/0014* (2013.01); *B60Y 2200/91* (2013.01); *B60Y 2200/92* (2013.01); *B60Y 2300/91* (2013.01); *B60Y 2400/112* (2013.01); *H01M 2220/20* (2013.01); *Y02T 10/7055* (2013.01); *Y10S 903/907* (2013.01)

(58) Field of Classification Search
USPC ......................................................... 320/109
See application file for complete search history.

(56) References Cited

U.S. PATENT DOCUMENTS

| 8,798,832 | B2* | 8/2014 | Kawahara | H01M 10/441 |
| | | | | 701/22 |
| 2006/0022643 | A1* | 2/2006 | Brost | G01R 31/3648 |
| | | | | 320/132 |
| 2006/0091862 | A1* | 5/2006 | Melichar | G01R 31/3648 |
| | | | | 320/132 |
| 2010/0244886 | A1* | 9/2010 | Kawahara | G01R 31/361 |
| | | | | 324/764.01 |
| 2015/0022158 | A1* | 1/2015 | Osawa | H01M 4/505 |
| | | | | 320/134 |

FOREIGN PATENT DOCUMENTS

| JP | 5051661 B2 | 10/2012 |
| JP | 2013-72659 A | 4/2013 |
| JP | 2013-148458 A | 8/2013 |
| WO | WO 2013/133113 A1 | 9/2013 |

OTHER PUBLICATIONS

Japanese Office Action issued in counterpart Japanese Application No. 2014-032903 dated Nov. 29, 2016 (four (4) pages).

Japanese Office Action issued in counterpart Japanese Application No. 2014-032903 dated Jun. 27, 2017 with English translation (eight pages).

Extended European Search Report issued in counterpart European Application No. 15751359.9 dated Oct. 9, 2017 (9 pages).

* cited by examiner

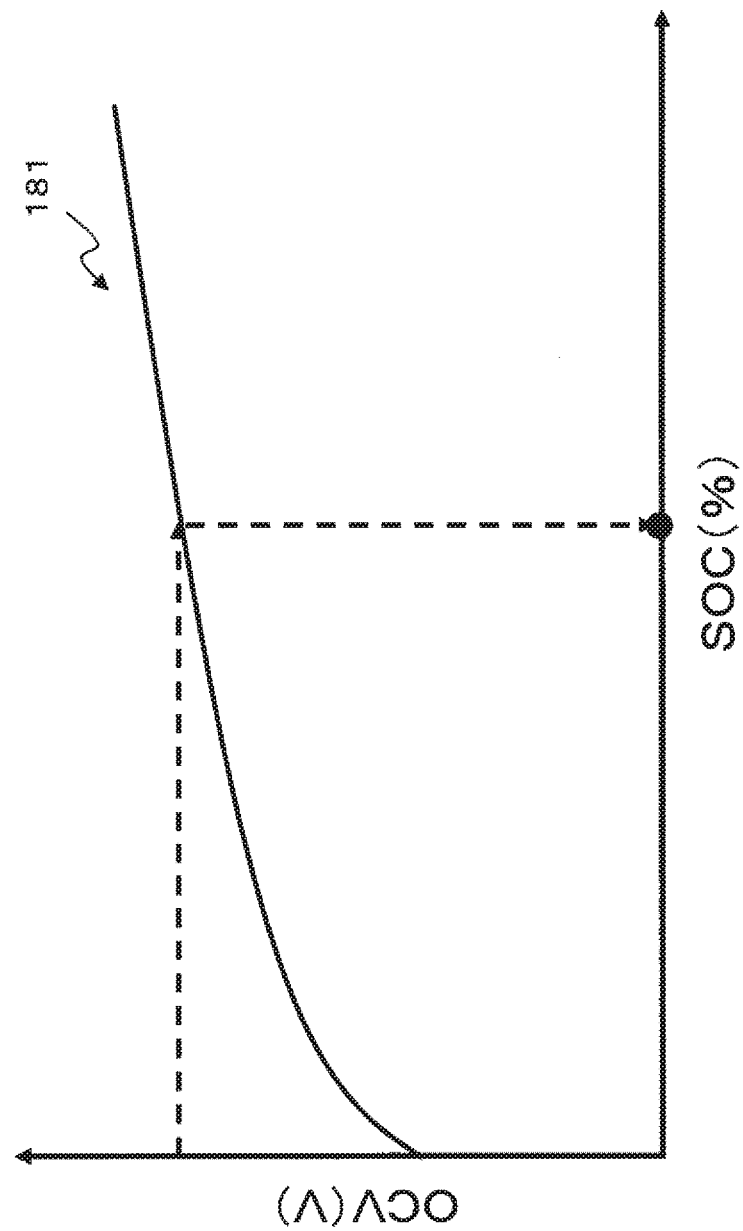

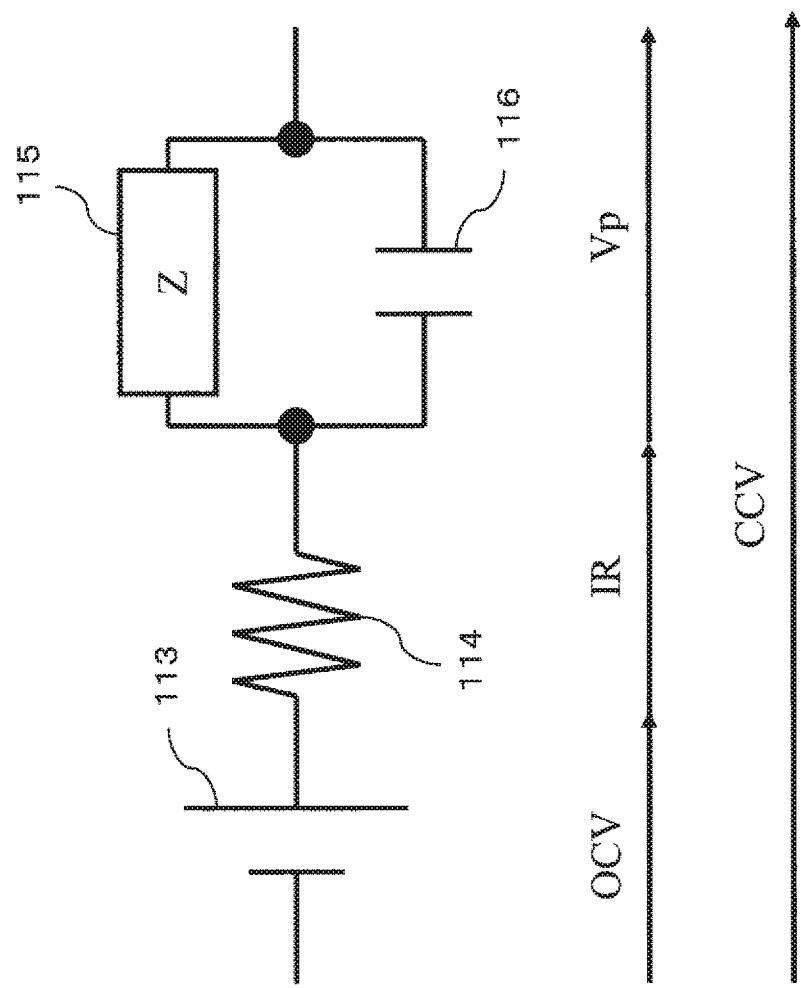

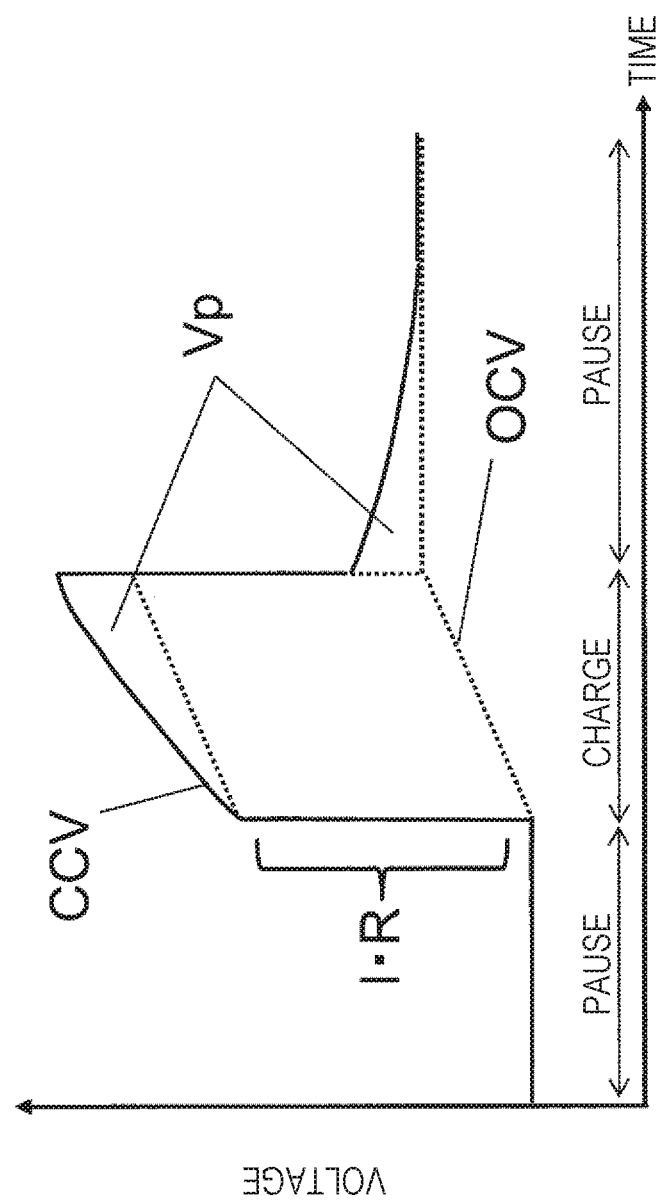

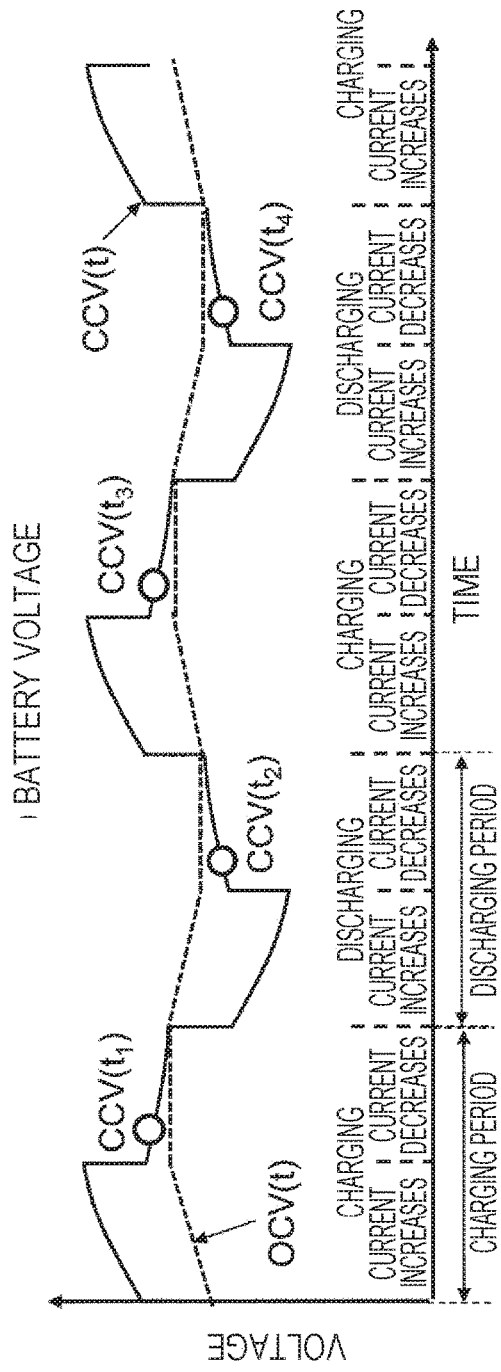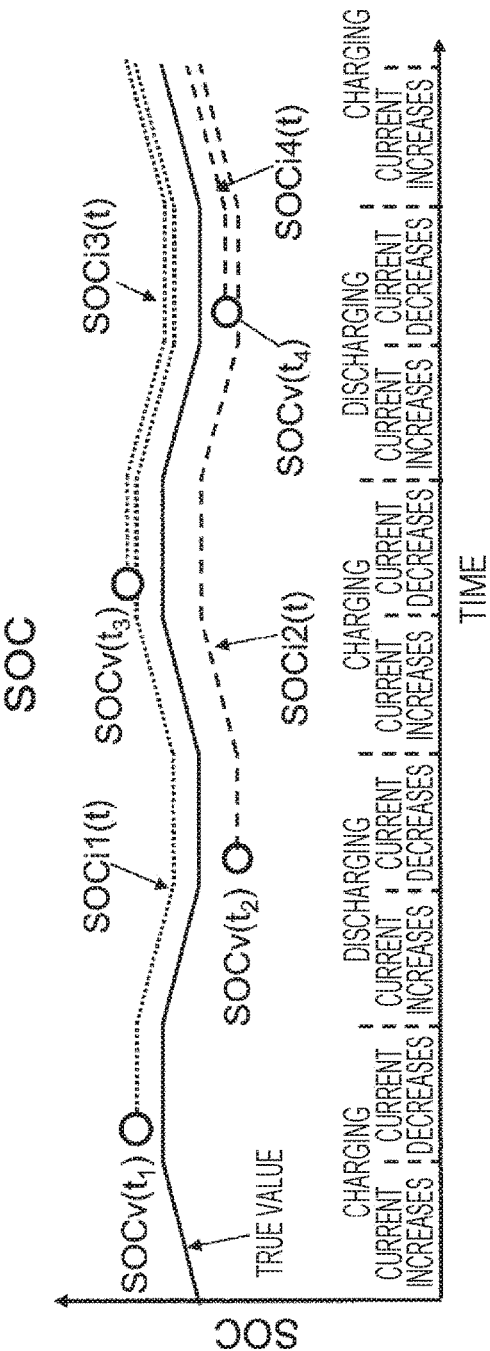
FIG. 7A
FIG. 7B

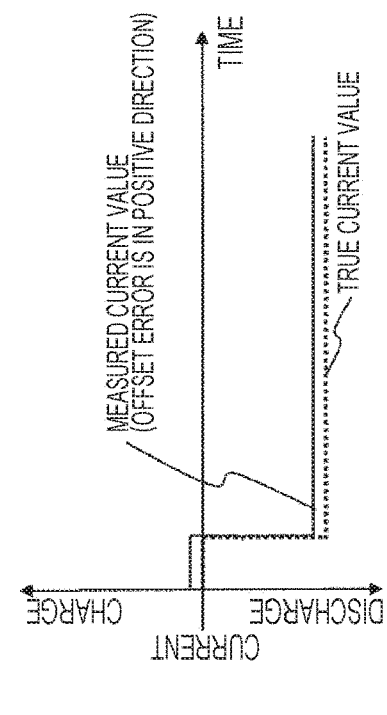
FIG. 10A1
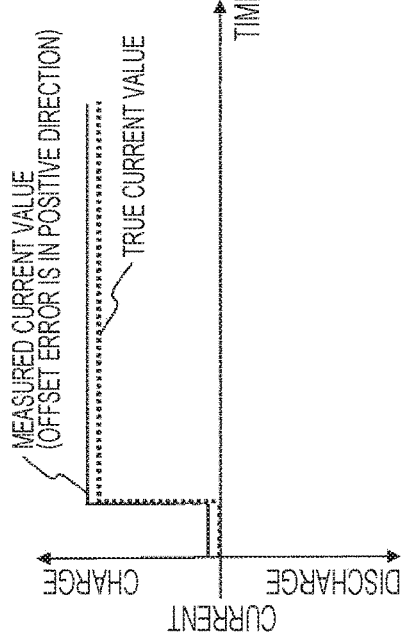
FIG. 10A2
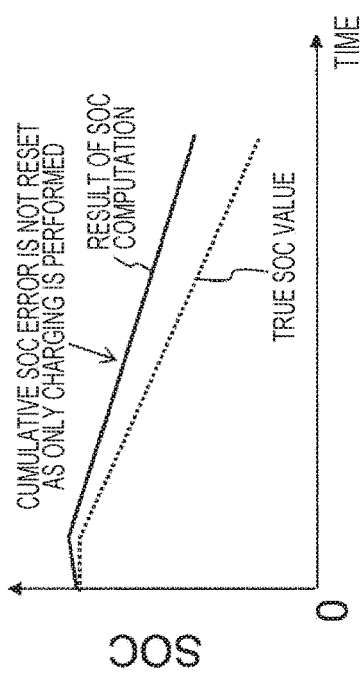
FIG. 10B1
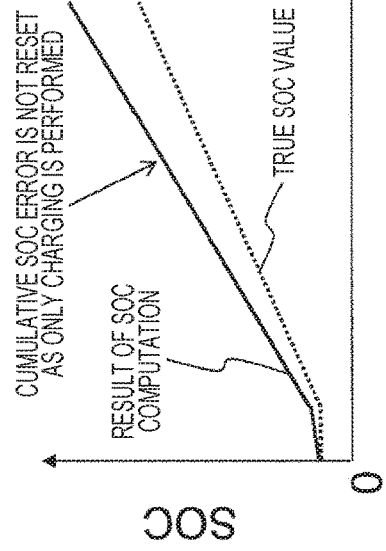
FIG. 10B2

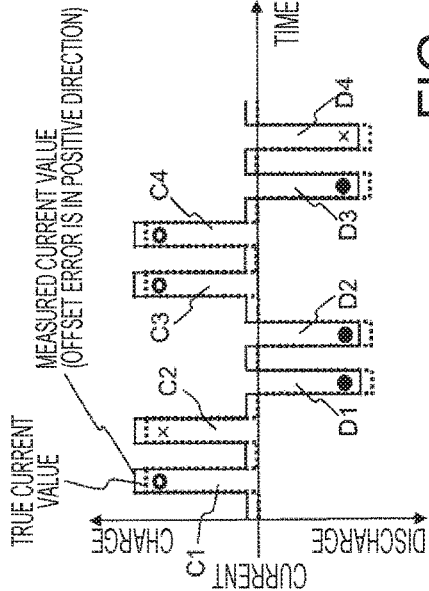
FIG. 11A1
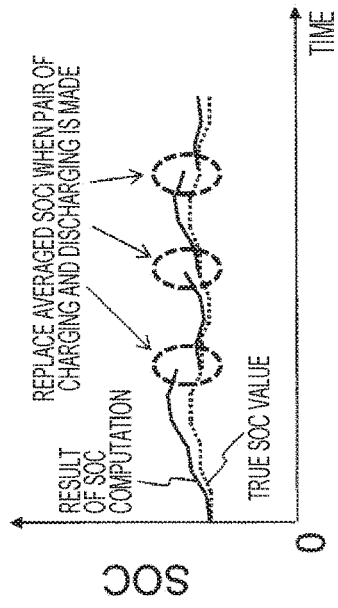
FIG. 11B1
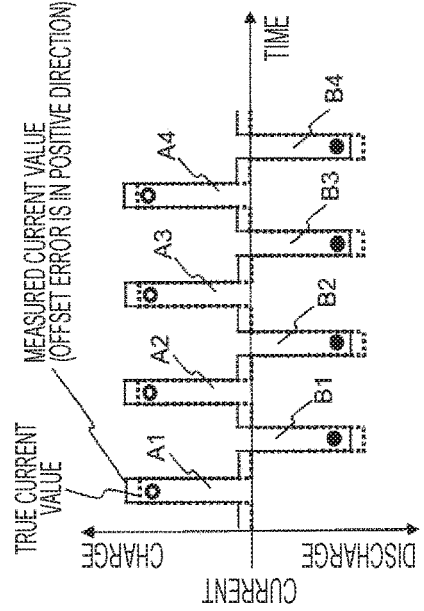
FIG. 11A2
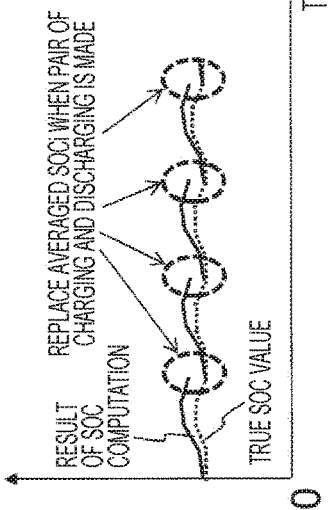
FIG. 11B2

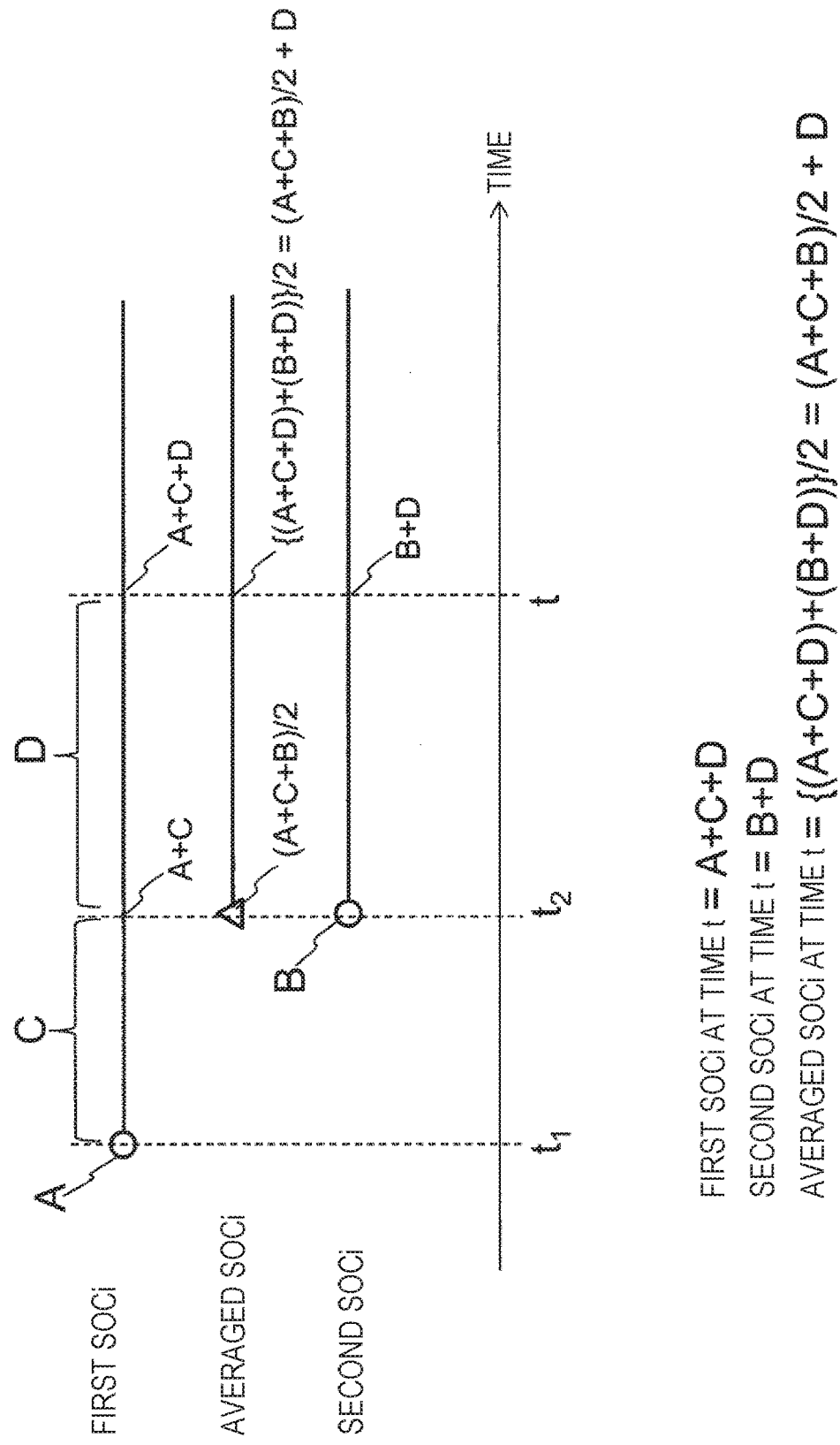

SECONDARY BATTERY SYSTEM

TECHNICAL FIELD

The present invention relates to a secondary battery system.

BACKGROUND ART

A power supply system, a distributed power storage system, an electric vehicle and the like using a power storage device such as a battery are equipped with a battery control circuit managing a state of the power storage device. A state of charge (SOC) is a representative example of an index indicating the state of the power storage device managed by the battery control circuit.

As one method of estimating the SOC, a current value flowing into and out of the battery is measured and integrated. This method integrates a measurement error included in the measured current value as well, and thus has a problem that an SOC error increases as time elapses.

In order to solve the aforementioned problem, PTL 1 discloses the following invention.

A charge or discharge current through a secondary battery is integrated to obtain a first integrated value, which is divided by a battery capacity and then added to an initial SOC value to continuously calculate a first SOC value. A terminal voltage across the secondary battery obtained at a timing of switching an operation between charging and discharging is corrected to approach an open circuit voltage to then obtain the SOC at that point as a second SOC value, where the initial SOC value is updated by the second SOC value every time the second SOC value is obtained to resume the integration computation of the first integrated value.

According to the invention described in PTL 1, the SOC error increasing as the measured current value is integrated can be updated at the timing of switching charging/discharging, whereby the accuracy of the SOC is effectively maintained.

CITATION LIST

Patent Literature

PTL 1: Publication of U.S. Pat. No. 5,051,661

SUMMARY OF INVENTION

Technical Problem

However, according to the invention described in PTL 1, a correction value used to correct the terminal voltage obtained at the timing of switching charging/discharging needs to be calculated. Battery characteristics need to be investigated beforehand in order to perform the correction and, in order to increase accuracy of the correction, the investigation needs to be performed closely. There has thus been required a large amount of time in the investigation.

Solution to Problem

A secondary battery system according to the invention described in claim 1 includes: a CCV acquisition unit which acquires a charging CCV at a predetermined charging point during a charging period of a battery and a discharging CCV at a predetermined discharging point during a discharging period of the battery; an SOC calculation unit which calculates a charging SOC on the basis of the charging CCV and a discharging SOC on the basis of the discharging CCV; a gap SOC error reduction processing unit which calculates, on the basis of the charging SOC and the discharging SOC, a corrected SOC having a reduced gap SOC error that is included in an SOC of the battery and results from a gap between a CCV and an OCV; and a cumulative SOC error reduction processing unit which replaces, at a predetermined replacement point, the SOC of the battery with the corrected SOC calculated by the gap SOC error reduction processing unit, updates the SOC of the battery, and reduces a cumulative SOC error included in the SOC of the battery and resulting from a measurement error of a current value.

Advantageous Effects of Invention

According to the secondary battery system of the present invention, a large amount of time is not required in investigating the battery characteristics. An accurate SOC can thus be calculated in a simple manner.

BRIEF DESCRIPTION OF DRAWINGS

FIG. 3 is an example of an SOC table 181 according to the present invention.

FIG. 4 is a diagram illustrating an equivalent circuit of a battery according to the present invention.

FIG. 5 is a diagram illustrating a voltage change of a unit cell 111 at the time of charging, for example.

FIGS. 7A and 7B are diagrams illustrating a calculation timing for an SOC computation according to the present invention.

FIGS. 10A1-10B2 are diagrams illustrating an example of the SOC computation according to the present invention.

FIGS. 11A1-11B2 are diagrams illustrating an example of the SOC computation according to the present invention.

FIG. 14 is a diagram illustrating a variation of the present invention.

DESCRIPTION OF EMBODIMENTS

First Embodiment

In a first embodiment, there will be described a case where the present invention is applied to a secondary battery system that is mounted in a vehicle system included in a hybrid vehicle (HEV), a plug-in hybrid vehicle (PHEV) and an electric vehicle (EV).

Figure 1:
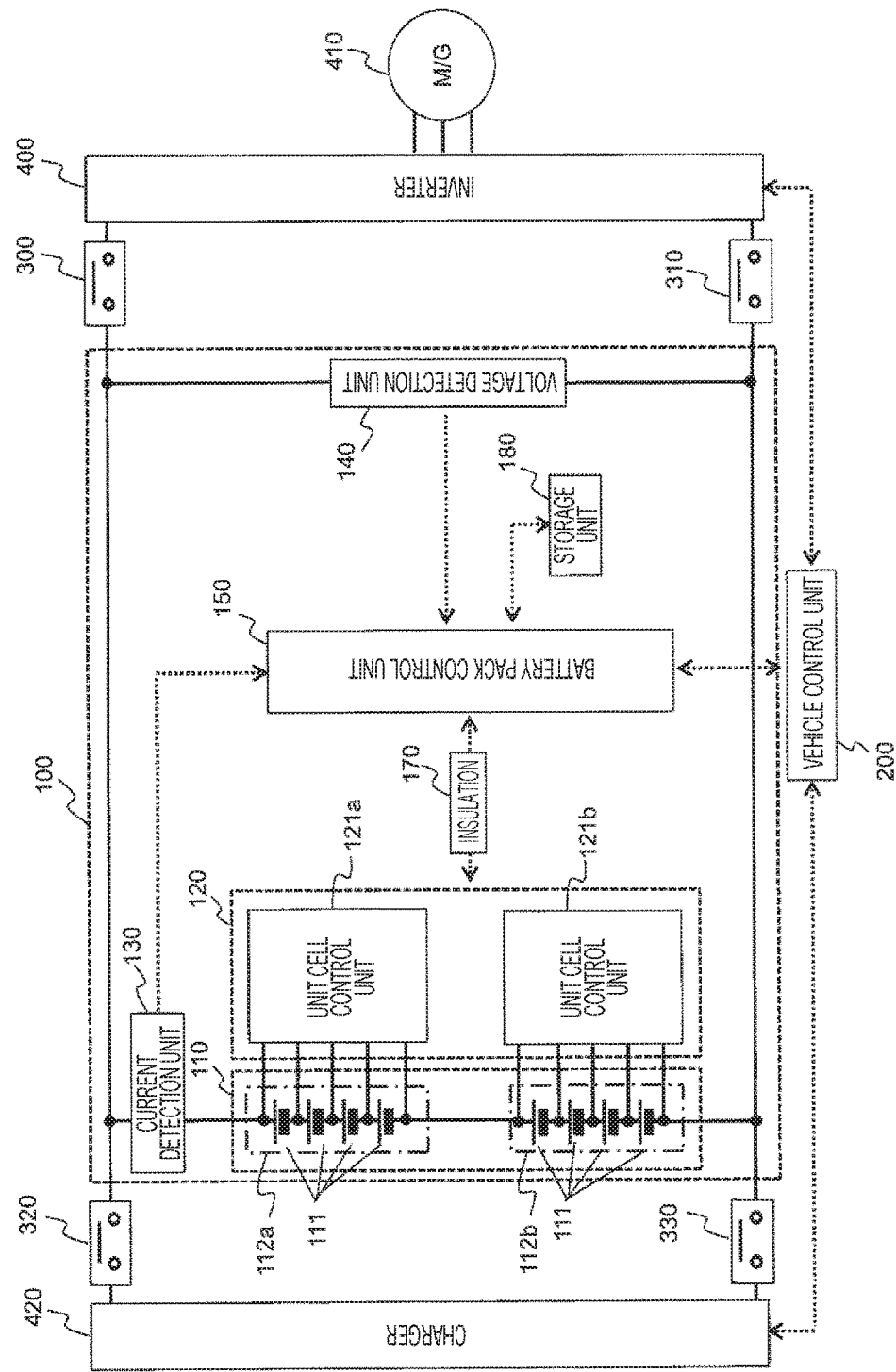
FIG. 1 is a diagram illustrating the configuration of a secondary battery system 100 and its periphery according to the present invention.

FIG. 1 is a diagram illustrating the configuration of a secondary battery system 100 and its periphery according to the first embodiment. The secondary battery system 100 is connected to an inverter 400 performing PWM control on a motor/generator 410 via relays 300 and 310. The secondary battery system 100 is also connected to a charger 420 via relays 320 and 330. A vehicle control unit 200 communicates with a battery pack control unit 150, the charger 420 and the inverter 400.

The secondary battery system 100 includes a battery pack 110, a unit cell management unit 120, a current detection unit 130, a voltage detection unit 140, the battery pack control unit 150, a storage unit 180, and an insulating element 170 typified by a photocoupler.

The battery pack 110 is formed of a plurality of unit cell groups 112. Here, the battery pack is formed of two unit cell groups, namely unit cell groups 112a and 112b (hereinafter collectively referred to as the unit cell group 112 in some cases). Each unit cell group 112 is formed of a plurality of unit cells 111.

The current detection unit 130 detects a current flowing through the battery pack 110. The voltage detection unit 140 detects a voltage across the battery pack 110.

The storage unit 180 stores information such as a capacity of each of the battery pack 110, the unit cell 111 and the unit cell group 112 when they are fully charged, a correspondence between an SOC and an open circuit voltage (OCV), and various set values required in estimating the SOC. The storage unit 180 can also store in advance characteristics information of the unit cell management unit 120, the unit cell control unit 121, the battery pack control unit 150 and the like. The various information stored in the storage unit 180 is retained even when the secondary battery system 100, the battery pack control unit 150 or the like stops operating. Note that the storage unit 180 stores an SOC table 181 as one that indicates the correspondence between the SOC and the open circuit voltage. Details will be described later with reference to FIG. 3.

The unit cell management unit 120 includes unit cell control units 121a and 121b (hereinafter collectively referred to as a unit cell control unit 121 in some cases) corresponding to the unit cell groups 112a and 112b, respectively. The unit cell control unit. 121 measures a battery voltage and temperature of the unit cell 111 included in the unit cell group 112 and monitors whether an abnormality is detected in the unit cell.

The unit cell management unit 120 manages the unit cell control unit 121 to indirectly manage the unit cell 111.

The battery pack control unit 150 receives, in the form of a signal, the battery voltage and temperature of the unit cell 111 transmitted from the unit cell management unit 120 via the insulating element 170, a value of the current flowing through the battery pack 110 that is transmitted from the current detection unit 130, a value of the voltage across the battery pack 110 transmitted from the voltage detection unit 140, and a command transmitted from the vehicle control unit 200 as appropriate.

The battery pack control unit 150 uses the aforementioned signal received from the unit cell management unit 120, the current detection unit 130, the voltage detection unit 140 and the vehicle control unit 200 as well as the SOC table 181 stored in the storage unit 180 to execute a computation by which the SOC and an SOH of the battery pack 110, chargeable/dischargeable current and power, an abnormal state and an amount of charge/discharge are detected. On the basis of a result of the computation, the battery pack control, unit 150 transmits, to the unit cell management unit 120, a command used by the unit cell control unit 121 to manage the unit cell 111 and the unit cell group 112. The battery pack control unit 150 also transmits the result of the computation and the command based thereon to the vehicle control unit 200 as well as stores the result of the computation in the storage unit 180 as needed.

The vehicle control unit 200 uses the information received from the battery pack control unit 150 to control the inverter 400 and the charger 420. While a vehicle travels, the secondary battery system 100 is connected to the inverter 400 and drives the motor/generator 410 by using energy stored in the battery pack 110. At the time of charging, the secondary battery system 100 is connected to the charger 420 and charged by power supplied from a household power supply or a charging stand.

The charger 420 is used in charging the battery pack 110 with use of an external power supply typified by the household power supply or the charging stand. In the present embodiment, the charger 420 is configured to control a charge voltage and a charge current on the basis of a command from the vehicle control unit 200 but may instead perform the control on the basis of a command from the battery pack control unit 150. The charger 420 can be installed inside or outside the vehicle depending on the structure of the vehicle, performance and an intended use of the charger 420, an installation condition of the external power supply and the like.

When the vehicle system equipped with the secondary battery system 100 is started up and travels, the secondary battery system 100 is connected to the inverter 400 under control of the vehicle control unit 200 to drive the motor/generator 410 by using the energy stored in the battery pack 110 and, at the time of regeneration, charge the battery pack 110 with power generated by the motor/generator 410. When the vehicle equipped with the secondary battery system 100 is connected to the external power supply typified by the household power supply or the charging stand, the secondary battery system 100 is connected to the charger 420 on the basis of information transmitted from the vehicle control unit 200, whereby the battery pack 110 is charged until a predetermined condition is met. The energy stored in the battery pack 110 by charging is used the next time the vehicle travels or used to operate an electric component or the like inside/outside the vehicle. The energy is also sent to the external power supply typified by the household power supply as needed.

Figure 2:
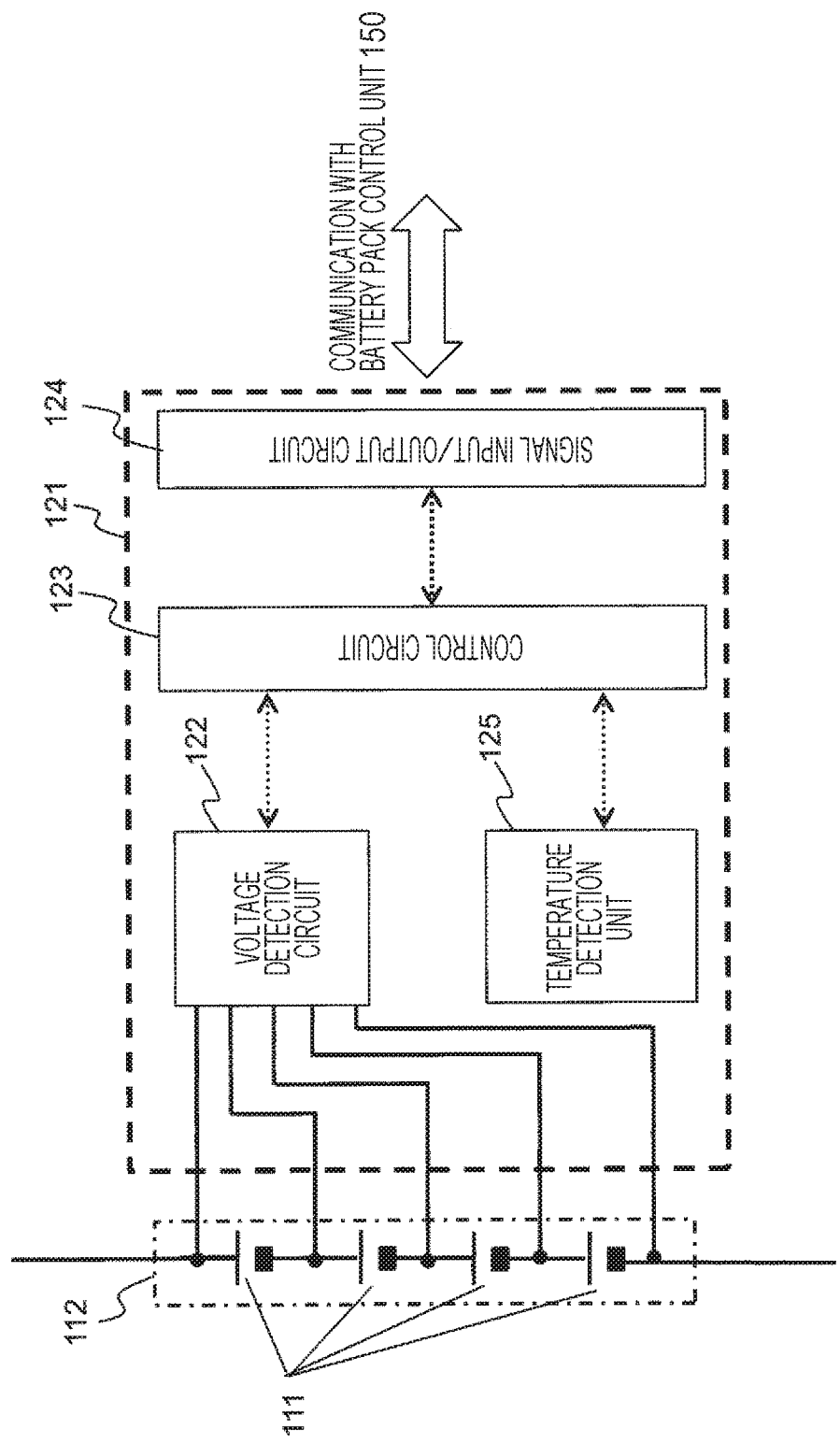
FIG. 2 is a diagram illustrating a circuit configuration of a unit cell control unit 121 and its periphery.

FIG. 2 is a diagram illustrating a circuit configuration of the unit cell control unit 121. The unit cell control unit 121 includes a voltage detection circuit 122, a control circuit 123, a signal input/output circuit 124 and a temperature detection unit 125.

The voltage detection circuit 122 measures a voltage across terminals of each unit cell 111.

The temperature detection unit 125 measures a single temperature of the unit cell group 112 as a whole and treats the temperature as a representative temperature value of the unit cell 111 making up the unit cell group 112. The temperature measured by the temperature detection unit 125 is used in various computations performed to detect a state of the unit cell 111, the unit cell group 112 or the battery pack 110.

The control circuit 123 receives measurement results from the voltage detection circuit 122 and the temperature detection unit 125 and transmits them to the battery pack control unit 150 via the signal input/output circuit 124. The control circuit can also transmit information to the voltage detection circuit 122 and the temperature detection unit 125 on the basis of information from the signal input/output circuit 124. Note that a balancing circuit generally implemented in the unit cell control unit 121 or its periphery, namely a circuit equalizing variations in the voltage and SOC between the unit cells 111, is omitted from the description, the variations occurring with self-discharge, a variation in the current consumption and the like.

FIG. 3 is a diagram illustrating an example of the SOC table 181 stored in the storage unit 180. The SOC table 181 is a data table describing a correspondence between the OCV of the unit cell 111 and the SOC of the unit cell 111. Although any data format may be adopted, the data table is represented in a graph format in this case for convenience of description. Note that while the data table is used in the present embodiment, the correspondence between the OCV and the SOC can also be represented by using a mathematical expression or the like. Another method may be employed as long as the method allows for a conversion from the OCV to the SOC or from the SOC to the OCV.

There will now be described a general method of calculating the SOC as a premise of describing a method of calculating the SOC according to the present invention.

The OCV of the unit cell 111 is acquired to acquire, from the SOC table 181 in FIG. 3, the SOC at time $t_n$ when the OCV is acquired. The SOC acquired from the SOC table 181 is called an SOCv. The SOCv at the time $t_n$ is expressed as in expression (1) below.

$$SOCv(t_n) = \mathrm{Map}(OCV) \qquad (1)$$

The SOC at only time $t_n$ can be obtained by expression (1) alone. Thus, an integrated value $\Delta SOC$ (t) of a charge or discharge current expressed in expression (2) is added to SOCv ($t_n$) to obtain a momentary SOC from time $t_n$ onward (such SOC will be hereinafter referred to as an SOCi) as expressed in expression (3).

$$\Delta SOC(t) = 100 \times (\int I(t)dt)/Q_{max} \qquad (2)$$

$$SOCi(t) = SOCv(t_n) + \Delta SOC(t) \qquad (3)$$

Here, $Q_{max}$ is the capacity of the unit cell 111 when it is fully charged. The general method of calculating the SOC has been described up to this point.

The SOCi obtained by the general method of calculating the SOC includes a first SOC error and a second SOC error as follows.

<First SOC Error>

The current detection unit 130 detects a charge or discharge current I (t) including a measurement error. This means that the time-integrated value $\Delta SOC$ (t) of the charge or discharge current in expression (2) includes an error. The error included in the charge or discharge current I (t) may be small but, for the time-integrated value $\Delta SOC$ (t) of the charge or discharge current, the error is accumulated as the time of integration gets longer to possibly result in a large error. The error included in $\Delta SOC$ (t) is called the first SOC error in the present description. As will be described later, the first SOC error is removed in the present invention.

<Second SOC Error>

The OCV is defined as the voltage across the terminals when no charge or discharge current flows nor does the voltage vary with time. The OCV is the voltage across the terminals of the unit cell 1 measured when the relays 300, 310, 320 and 330 illustrated in FIG. 1 are open and at the same time the voltage across the unit cell 111 does not vary with time. The voltage across the terminals of the unit cell 111 can also be regarded as the OCV in the case where the voltage is measured when charging/discharging of the battery pack 110 is not started even with the relays 300, 310, 320 and 330 closed or when the voltage across the unit cell 111 does not vary with time because it is left as is for a long period of time after the charging/discharging is started and stopped. However, the relays 300, 310, 320 and 330 are closed when the battery pack 110 is in use, and the aforementioned situation where charging/discharging is not performed at all is not a frequent case. In other words, it is rare to be able to result in acquiring the OCV while the battery pack 110 is in use.

The present invention is aimed at removing the first SOC error included in $\Delta SOC$ (t). In order to achieve this, the SOC needs to be re-detected from the battery voltage while the battery pack 110 is in use (the relays 300, 310, 320 and 330 are closed) but, as described above, the OCV can rarely be acquired while the relays 300, 310, 320 and 330 are closed. Accordingly, the SOCv expressed in expression (1) can be acquired by using the battery voltage during charging/discharging or what is called a closed circuit voltage (CCV), and the SOC table 181 described above. There is a gap between the CCV and the OCV due to a factor as described later. Moreover, as described above, the SOC table 181 represents the correspondence between the OCV and the SOC so that the SOCv acquired from the SOC table 181 in FIG. 3 while treating the CCV as the OCV results in an SOC error. This error is called the second SOC error in the present description. As will be described later, the second SOC error is also removed in the present invention. There is no need to calculate a correction value to convert the CCV into the OCV, nor are a complex computation and an investigation of battery characteristics required.

There will now be described the factor causing the gap between the OCV and the CCV that causes the second SOC error, with reference to FIG. 4. FIG. 4 is an example of a schematic diagram illustrating an equivalent circuit of the unit cell 111. The unit cell 111 is formed of a voltage source 113, an internal resistance 114, an impedance 115, and a capacitance 116. The impedance 115 and the capacitance 116 are in parallel connection, while the parallel-connected pair is in series connection with the voltage source 113 and the internal resistance 114.

The CCV is defined as the voltage across the terminals of the unit cell 111 when the charge or discharge current flows therethrough or when the voltage varies with time under the influence of a current flowing in the past though there is no current flowing at the moment. When I denotes the charge or discharge current, R denotes the internal resistance 114, and Vp denotes a voltage component resulting from the impedance 115 and the capacitance 116, as illustrated in FIG. 4 and expression (4) below, the CCV includes the OCV, IR, and Vp as components.

$$CCV = OCV + IR + Vp \qquad (4)$$

Here, the OCV is a voltage across the voltage source 113 and a voltage across the terminals of the unit cell 111 when there is no charge or discharge current flowing and at the same time the voltage is constant over time. IR is a voltage component resulting from the internal resistance 114. Vp is a polarization potential and the voltage component resulting from the parallel-connected pair of the impedance 115 and the capacitance 116. As a result, the CCV including IR and Vp as the voltage components deviates from the OCV.

FIG. 5 is a diagram illustrating a temporal change in the voltage across the terminals of the unit cell 111 at the time of charging, for example. The voltage is temporally constant prior to charging. This voltage is the OCV. The voltage jumps by the amount corresponding to IR when charging is started, and Vp arises as well. When charging is stopped, the voltage drops by the amount corresponding to IR whereas Vp does not drop right after charging is stopped but requires time until it drops completely. It is because of the behavior of Vp that the OCV cannot be acquired right after charging.

Figure 6A:
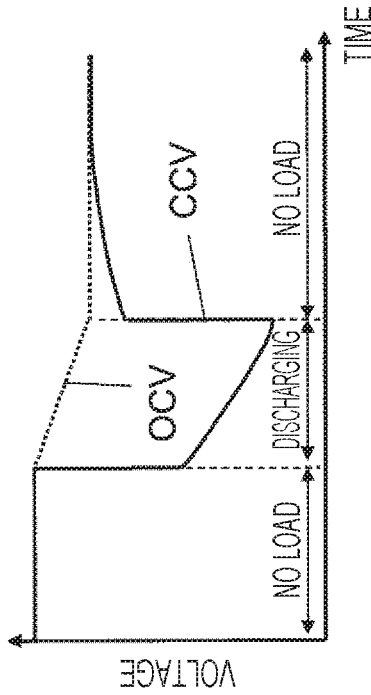
FIGS. 6A and 6B are diagrams illustrating a voltage change of the unit cell 111 at the times of charging and discharging.
Figure 6B:
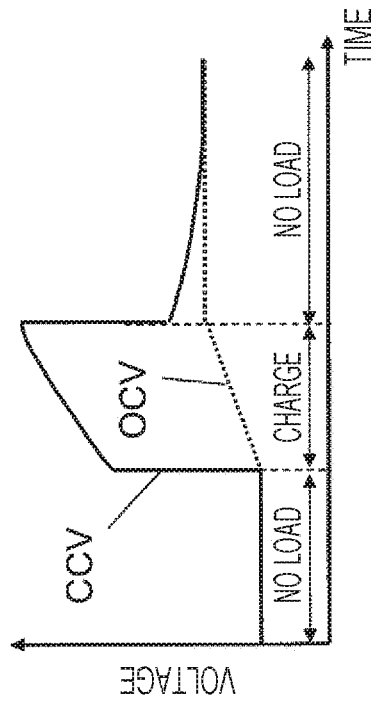

FIGS. 6(a) and 6(b) illustrate a temporal change in the voltage across the unit cell 111 at the times of charging and discharging, respectively. FIG. 6(a) illustrates an example at the time of charging, while FIG. 6(b) illustrates an example at the time of discharging. As illustrated in FIGS. 6(a) and 6(b), the CCV has the property of being higher than the OCV at the time of charging and lower than the OCV at the time of discharging. The present invention uses this property.

When the CCV at the time of charging in FIG. 6(a) is treated as the OCV to acquire the SOC from the relationship illustrated in FIG. 3, the acquired SOC is higher than a true value of the SOC since the CCV is higher than the OCV. That is, the second SOC error in a positive direction occurs at the time of charging. On the other hand, the CCV is lower than the OCV at the time of discharging as in FIG. 6(b), so that the acquired SOC is also lower than the true value of the SOC. That is, the second SOC error in a negative direction occurs at the time of discharging. In view of the aforementioned characteristic of the second SOC error, it is thought that the second SOC error occurring at the time of acquiring the SOC from the CCV can be reduced by calculating the SOC from the CCV at the times of charging and discharging and averaging the two SOCs.

The SOC computation intended for the unit cell 111 has been described with reference to FIGS. 3 to 6(b). An SOC computation intended for the battery pack 110 formed of a plurality of the unit cells 111 combined will be described with reference to FIGS. 7(a) and 7(b) onward, where the concept is substantially the same as when the computation is intended for the unit cell 111.

Note that when the computation is intended for the battery pack 110, an SOC of the battery pack 110 is obtained from a voltage across the battery pack 110 by the following method. First, the voltage across the battery pack 110 is divided by the number of series to be converted into the voltage across the unit cell 111. The voltage across the unit cell 111 is then input to the SOC table 181 in FIG. 3 and converted into an SOC, which is treated as the SOC of the battery pack 110.

FIGS. 7(a) and 7(b) illustrate the SOC computation according to the first embodiment. Before describing FIGS. 7(a) and 7(b), a charging period and a discharging period of the first embodiment will be defined. A period has a beginning and an end.

A beginning and an end of the charging period in the first embodiment are as follows.

The beginning of the charging period in the first embodiment corresponds to the start of charging, namely when a charge current starts to flow.

The end of the charging period in the first embodiment corresponds to the start of discharging.

A period delimited by the beginning and the end is the charging period of the first embodiment. FIG. 7(a) illustrates an example of the charging period.

A beginning and an end of the discharging period in the first embodiment are as follows.

The beginning of the discharging period in the first embodiment corresponds to the start of discharging, namely when a discharge current starts to flow.

The end of the discharging period in the first embodiment corresponds to the start of charging.

A period delimited by the beginning and the end is the discharging period of the first embodiment. FIG. 7(a) illustrates an example of the discharging period.

Note that those definitions apply to second and third embodiments to be described later. Definitions of charging and discharging periods in a fourth embodiment will be provided where the fourth embodiment will be described.

FIG. 7(a) illustrates the battery voltage, and FIG. 7(b) illustrates the SOC. The SOC computation is performed on the basis of the CCV in the present invention. However, in order to acquire the SOC under the condition closest possible to the OCV, the CCV at the time the charge current or discharge current is decreased is used to compute and acquire an initial SOC value, namely $SOCv(t_1)$, $SOCv(t_2)$, $SOCv(t_3)$, and $SOCv(t_4)$, from the SOC table 181 illustrated in FIG. 3. The charge or discharge currents are time-integrated after acquiring the SOCv, so that an outcome of the integration is added to the SOCv to acquire a momentary SOC, namely $SOCi1(t)$, $SOCi2(t)$, $SOCi3(t)$, and $SOCi4(t)$ illustrated in the figure. Note that from expressions (1) to (3), the initial SOC value and the momentary SOC thereafter will be hereinafter referred to as the SOCv and the SOCi, respectively. Moreover, computing of the SOCi will be referred to as an SOCi computation.

The second SOC errors in the opposite directions occur at the times of charging and discharging, as described above. Accordingly, an SOCi obtained by the SOCi computation started at the time of charging (such SOCi will be hereinafter referred to as a charging SOCi) and an SOCi obtained by the SOCi computation started at the time of discharging (such SOCi will be hereinafter referred to as a discharging SOCi) are paired up (such pair will be hereinafter referred to as an SOCi pair) and subjected to averaging processing, whereby an averaged SOCi (hereinafter referred to as an averaged SOCi) is acquired.

At time $t_1$ of FIG. 7(b), for example, the averaging processing is not performed because only the $SOCi1(t)$ being the charging SOCi is acquired. From time $t_2$ onward, the $SOCi2(t)$ being the discharging SOCi can be acquired. Accordingly, from time $t_2$ onward, both the $SOCi1(t)$ being the charging SOCi and the $SOCi2(t)$ being the discharging SOCi can be used so that the two is subjected to the averaging processing to be able to acquire the averaged SOCi. This averaged SOCi is recognized as the SOC of the battery pack 110. Note that the second SOC error is reduced by the aforementioned averaging processing.

Likewise, the averaging processing is not performed at time $t_3$ because only the $SOCi3(t)$ being the charging SOCi can be acquired but, from time $t_4$ onward, the $SOCi4(t)$ being the discharging SOCi can be acquired so that the $SOCi3(t)$ and $SOCi4(t)$ are paired up to be able to acquire the averaged SOCi.

Then, the averaged SOCi of the pair of $SOCi1(t)$ and $SOCi2(t)$ recognized as the SOC of the battery pack 110 up to that point is updated by the averaged SOCi of the pair of $SOCi3(t)$ and $SOCi4(t)$, whereby the averaged SOCi of the pair of $SOCi3(t)$ and $SOCi4(t)$ is recognized as a new SOC of the battery pack 110. The averaged SOCi of the pair of $SOCi1(t)$ and $SOCi2(t)$ includes a larger error associated with time-integrating the charge/discharge currents, namely the first SOC error, than the averaged SOCi of the pair of $SOCi3(t)$ and $SOCi4(t)$, whereby the first SOC error is reduced as a result of the update.

While the averaged SOCi is acquired from one charging SOCi and one discharging SOCi in the example above, the second SOC error can be reduced as long as at least one of each of the charging SOCi and the discharging SOCi is included in the averaged SOCi. Therefore, for example, the averaged SOCi may be acquired by using a plurality of each of the charging SOCis and the discharging SOCis that are the same in number such as three charging SOCis and three discharging SOCis, or, although the second SOC error is reduced not as much, the averaged SOCi can be acquired by using the charging SOCi and the discharging SOCi that are different in number (such as two charging SOCis and three discharging SOCis).

Figure 8:
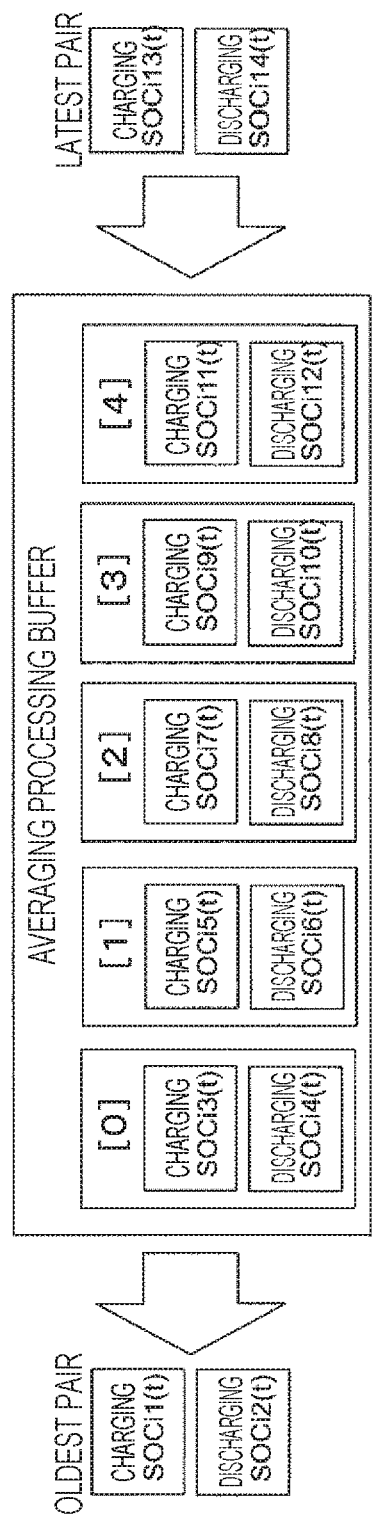
FIG. 8 is a diagram illustrating averaging processing of the SOC computation according to the present invention.

There can also be applied a method of calculating the average by holding a plurality of SOCi pairs where an old SOCi pair is discarded as a new SOCi pair is obtained. FIG. 8 illustrates an example of the averaging processing performed with a total of ten SOCis while holding five SOCi pairs. An averaging processing buffer illustrated in FIG. 8 can hold five SOCi pairs. The five SOCi pairs being held are used to acquire the averaged SOCi. When the latest SOCi pair is obtained, the oldest SOCi pair is discarded to take the latest SOCi pair in the averaging processing buffer. The oldest SOCi pair in the averaging processing buffer is subjected to the integration computation of the measured current values the longest period of time among the SOCi pairs held in the averaging processing buffer, and thus includes the largest first SOC error. The latest SOCi pair includes the least amount of the first SOC error. The first SOC error can thus be reduced by discarding the oldest SOCi pair and taking in the latest SOCi pair as described above. Note that it can be selected by setting to perform averaging with SOCi pairs held at that point before five SOCi pairs are held or not perform averaging until five pairs are held.

Figure 9:
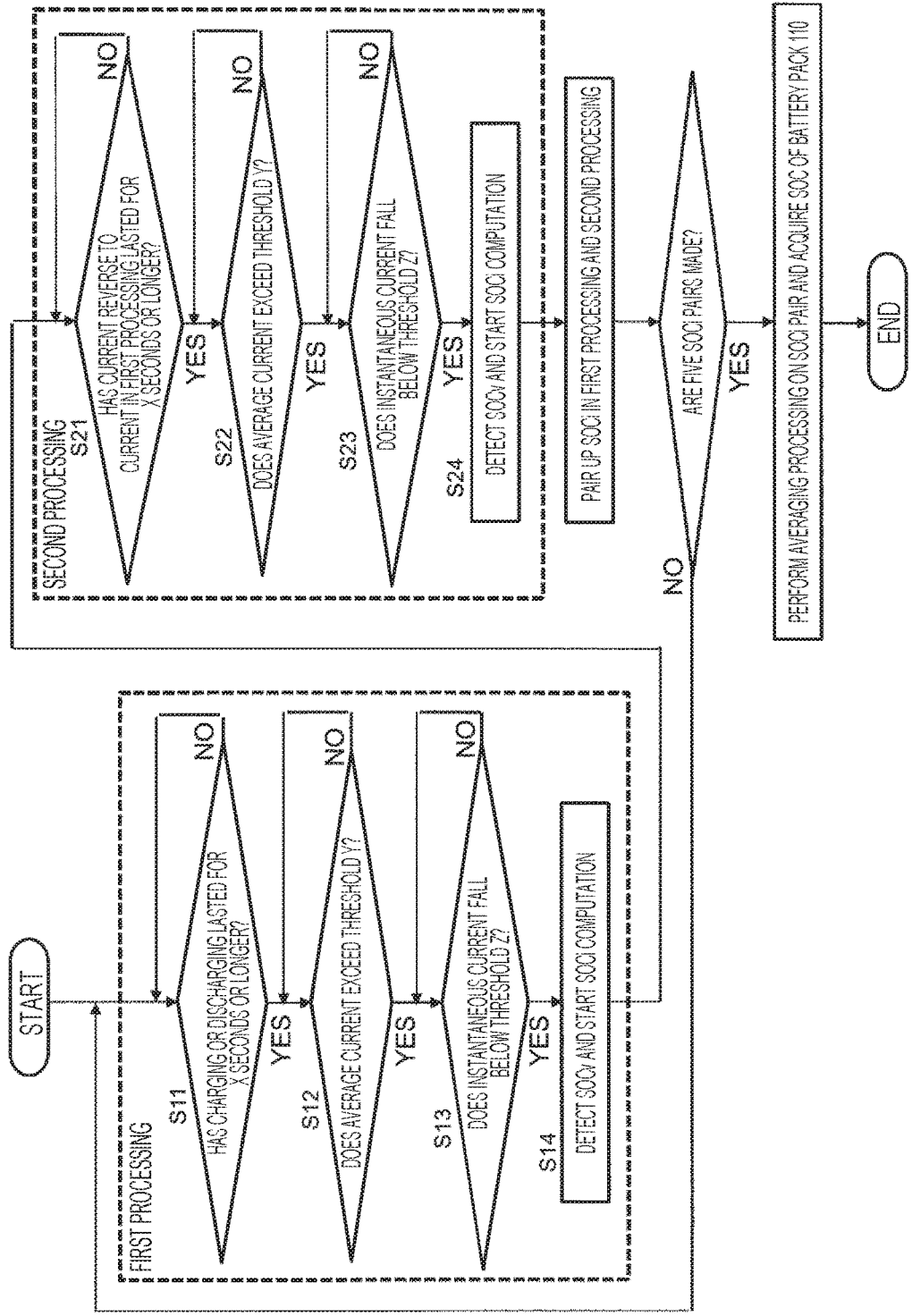
FIG. 9 is a flowchart illustrating the flow of processing of the SOC computation according to the present invention.

FIG. 9 will be used to describe a procedure of acquiring the SOC of the battery pack 110 of the first embodiment employing the averaging processing illustrated in FIG. 8. The processing is performed when a CPU runs a program stored in a ROM of the battery pack control unit 150. As illustrated in first processing in FIG. 9, when the current detection unit 130 detects the charge current or discharge current flowing through the battery pack 110 formed of the unit cell 111, the battery pack control unit 150 determines whether or not the charge current or discharge current detected by the current detection unit 130 lasts for a threshold of X seconds or longer in step S11, the threshold being stored in the storage unit 180. The processing proceeds to step S12 when the determination in step S11 is affirmative. In step S12, the battery pack control unit 150 finds an average value of the charge current or discharge current and determines whether or not the average value exceeds a threshold Y stored in the storage unit 180. The processing proceeds to step S13 when the determination in step S12 is affirmative. In step S13, the battery pack control unit 150 determines whether the current value detected by the current detection unit 130 falls below a threshold Z stored in the storage unit 180. When the determination in step S13 is affirmative, the battery pack control unit 150 in step S14 acquires the SOCv from the CCV obtained from the unit cell management unit 120 or the voltage detection unit 140, and starts the SOCi computation by using the SOCv as the initial SOC value.

The battery pack control unit 150 proceeds to second processing after executing step S14. In step S21 of the second processing, the battery pack control unit 150 determines the direction of flow of the current measured by the current detection unit 130. The second processing is performed with respect to the charge or discharge current reverse to the charge or discharge current detected in the first processing; that is, the second processing is performed with respect to the discharge current when the SOCi computation pertaining to the charge current is executed in the first processing, whereas the second processing is performed with respect to the charge current when the SOCi computation pertaining to the discharge current is detected in the first processing. In step S21, the battery pack control unit 150 determines whether or not the current detected by the current detection unit 130 lasts for X seconds or longer. The processing proceeds to step S22 when the determination in step S21 is affirmative. In step S22, the battery pack control unit 150 finds an average value of the charge current or discharge current and determines whether or not the average value exceeds the threshold Y stored in the storage unit 180. The processing proceeds to step S23 when the determination in step S22 is affirmative. In step S23, the battery pack control unit 150 determines whether the current value detected by the current detection unit 130 falls below the threshold Z stored in the storage unit 180. When the determination in step S23 is affirmative, the battery pack control unit 150 in step S24 acquires the SOCv from the CCV obtained from the unit cell management unit 120 or the voltage detection unit 140, and starts the SOCi computation by using the SOCv as the initial SOC value.

The battery pack control unit 150 pairs up the SOCi started in the first processing and the SOCi started in the second processing, performs the averaging processing when five pairs are made, and recognizes the averaged result as the SOC of the battery pack 110. The averaging processing can reduce the second SOC errors resulting from the gap between the CCV and the OCV and included in the charging SOCi and the discharging SOCi.

Note that the first processing and second processing illustrated in FIG. 9 can also be modified as follows. First, the amount of current flowing when charging or discharging is counted in the first processing. When the current value at the time of charging or discharging falls below the threshold Z, the battery pack control unit 150 acquires the SOCv from the CCV obtained from the unit cell management unit 120 or the voltage detection unit 140, and starts the SOCi computation by using the SOCv as the initial SOC value. Then in the second processing, the direction of flow of the current measured by the current detection unit 130 is determined to perform the second processing with respect to the charge or discharge current reverse to the charge or discharge current detected in the first processing; that is, the second processing is performed with respect to the discharge current when the SOCi computation pertaining to the charge current is executed in the first processing, whereas the second processing is performed with respect to the charge current when the SOCi computation pertaining to the discharge current is detected in the first processing. In the second processing, the amount of current flowing in a reverse direction to that in the first processing is counted to detect the amount of current equivalent to that in the first processing then, when the instantaneous current falls below the threshold Z, the battery pack control unit 150 acquires the SOCv from the CCV obtained from the unit cell management unit 120 or the voltage detection unit 140 and starts the SOCi computation by using the SOCv as the initial SOC value. Then, as with the aforementioned case, the battery pack control unit 150 pairs up the SOCi started in the first processing and the SOCi started in the second processing, performs the averaging processing when five pairs are made, and recognizes the averaged result as the SOC of the battery pack 110.

Various charge/discharge patterns will now be illustrated with reference to FIGS. 10(a1) to 11(b2) to describe the effect when the present invention is applied to the patterns.

FIG. 10(a1) illustrates a temporal change in the charge current in a first pattern in which charging continues, and FIG. 10(a2) illustrates a temporal change in the SOC. FIG. 10(b1) illustrates a temporal change in the discharge current in a second pattern in which discharging continues, and FIG. 10(b2) illustrates a temporal change in the SOC. There is no switching between charging and discharging in the first and second patterns, whereby the present invention cannot be applied to these patterns nor can the effect of reduction of the first SOC error and the second SOC error be obtained.

Specifically, in the case of the first pattern, the charging SOCi can be acquired but the discharging SOCi cannot. Likewise, in the case of the second pattern, the discharging SOCi can be acquired but the charging SOCi cannot. The first SOC error resulting from the integrated value of the charge or discharge currents can be reduced by replacement with the averaged SOCi being the averaged result of the charging SOCi and the discharging SOCi, but in the first and second patterns in which the averaging processing is not performed because only one of the charging SOCi and the discharging SOCi can be acquired as described above, the first SOC error cannot be reduced but is accumulated with time. In both FIGS. 10(a1) and 10(b1), a measurement error of the current detection unit 130 causing the first SOC error has a value in a positive direction as an offset, whereby the first SOC error illustrated in each of FIGS. 10(a2) and 10(b2) also has a value in a positive direction.

FIG. 11(a1) illustrates a temporal change in the charge or discharge current in a third pattern in which charging and discharging are repeated alternately, and FIG. 11(a2) illustrates a temporal change in the SOC. FIG. 11(b1) illustrates a temporal change in the charge or discharge current in a fourth pattern in which charging performed twice in succession followed by discharging performed twice in succession are repeated, and FIG. 11(b2) illustrates a temporal change in the SOC.

In order to clearly display a timing at which the SOC is subjected to the averaging processing and the SOCv is acquired, FIGS. 11(a1) to 11(b2) illustrate an example of repeating processing that reduces the first SOC error and the second SOC error by making a single pair of SOCis and performing the averaging processing.

As with the first and second patterns, a measurement error of the current detection unit 130 causing the first SOC error also has a value in a positive direction as an offset in the third and fourth patterns. Reference numerals A1, A2, A3 and A4 are assigned chronologically to the charging performed in the third pattern, reference numerals B1, B2, B3 and B4 are assigned chronologically to the discharging performed in the third pattern, C1, C2, C3 and C4 are assigned chronologically to the charging performed in the fourth pattern, and D1, D2, D3 and D4 are assigned chronologically to the discharging performed in the fourth pattern. Moreover, in FIGS. 11(a1) and 11(b1), "○" (white circle) indicates charging that contributes to securing of the SOCi pair, "●" (black circle) indicates discharging that contributes to securing of the SOCi pair, and "x" (cross) indicates charging or discharging that does not contribute to securing of the SOCi pair.

The SOCi pair cannot be made while only charging or discharging is detected, in which case the first SOC error keeps accumulating. The SOCi pair can be made when each of charging and discharging occurs at least once, in which case the averaged SOCi can be acquired by performing the averaging processing and replace the averaged SOCi up to that point to be able to reduce the first SOC error of the battery pack 110. The second SOC error can also be reduced by the averaging effect while reducing the first SOC error.

The characteristics of the present invention will be specifically described by applying the present invention to the third and fourth patterns.

In the third pattern, the SOCi pair cannot be made when the charging A1 takes place since only the charging SOCi is acquired. The SOCi pair can be made when the discharging B1 takes place since the discharging SOCi acquired thereby can be paired with the charging SOCi acquired by the charging A1. As a result, the averaging processing can be performed to be able to reduce the first SOC error and the second SOC error at the point the discharging B1 takes place. The same can be said for the charging and discharging that follow.

In the fourth pattern, the SOCi pair cannot be made when the charging C1 takes place since only the charging SOCi is acquired. The SOCi pair cannot be made either when the charging C2 takes place since only the charging SOCi is acquired. The SOCi pair can be made when the succeeding discharging D1 takes place since the discharging SOCi acquired thereby can be paired with the charging SOCi acquired by the charging C1. From then on, the SOCi pair can be made between the discharging D2 and the charging C3, and between the charging C4 and the discharging D3. The discharging D4 does not contribute to securing of the SOCi pair as far as the example illustrated in FIG. 11(b1), but can contribute to securing of the SOCi pair when charging follows or not contribute to securing of the SOCi pair when discharging follows and charging/discharging is stopped thereafter.

Note that while the SOCi acquired by the charging C1 contributes to securing of the SOCi pair but the SOCi acquired by the charging C2 does not in the fourth pattern, the SOCi pair can also be made with the SOCi acquired by the charging C2 and the discharging SOCi acquired by the discharging D1. As the SOCi computations for the charging SOCi and the discharging SOCi start at closer timings, the error associated with the time-integrated charge or discharge current caused by a time difference between the two becomes smaller.

The following effect can be achieved by the secondary battery system of the first embodiment.

(I) The secondary battery system of the first embodiment acquires the SOCv by using the SOC table 181 stored in the storage unit 180 to convert the CCV of the battery pack 110 into the SOC, the CCV being acquired by the unit cell management unit 120 or the voltage detection unit 140 during the charging period. From then on, the charging SOCi that is the SOC changing moment by moment is acquired by performing the SOCi computation, namely adding to the SOCv the value obtained by dividing the time-integrated value of the charge or discharge current through the battery pack 110 by the capacity of the battery when it is fully charged, the charge or discharge current being detected by the current detection unit 130. The similar processing is performed during the discharging period to acquire the discharging SOCi. The pair of the charging SOCi and the discharging SOCi, namely the SOCi pair, is made and subjected to the averaging processing so that the averaged SOCi is acquired. This averaged SOCi is treated as the SOC of the battery pack 110.

As a result, the SOC error resulting from the gap between the OCV and the CCV, namely the second SOC error, can be reduced. A correction value used for a conversion into the open circuit voltage need not be calculated in the present invention, whereby computational throughput and the volume of a battery charge/discharge test investigating the battery characteristics can be reduced.

The following method can be employed as a method of obtaining the OCV from the CCV, for example. Expression (4) is modified into the following expression (5) by transposing the OCV to a left side and the other terms to a right side of the expression.

$$OCV = CCV - IR - Vp \quad (5)$$

Expression (5) is used to be able to correct the CCV and obtain the OCV. As one can see from FIG. 4 and expression (5), the battery characteristics such as the internal resistance 114, the impedance 115 and the capacitance 116 need to be investigated and obtained in advance by charging and discharging the unit cell 111 in order to correct the CCV. Moreover, computational processing using those battery characteristics is required.

In the present invention, however, the second SOC error resulting from the difference between the CCV and the OCV can be corrected without obtaining those battery characteristics.

(II) In the secondary battery system of the first embodiment, when a new averaged SOCi is acquired, the averaged SOCi treated as the SOC of the battery pack 110 up to that point is replaced by the new averaged SOCi at that point, whereby the SOC of the battery pack 110 is updated.

As a result, there can be reduced the first SOC error being the SOC error that results from the error associated with the time-integrated charge or discharge current detected by the current detection unit 130 and including the current measurement error.

(III) The averaged SOCi can be obtained by applying the averaging processing, which collects a plurality of averaged SOCis to discard an old SOCi pair once a new SOCi pair is obtained, and be treated as the SOC of the battery pack 110.

As a result, the second SOC errors resulting from the gap between the CCV and the OCV and included in the charging SOCi and the discharging SOCi can be reduced. The first SOC error can also be reduced by updating the averaged SOCi.

(IV) The second SOC error can be reduced when at least one of each of the charging SOCi and the discharging SOCi is included in acquiring the averaged SOCi. Therefore, for example, the averaged SOCi may be acquired by using a plurality of each of the charging SOCis and the discharging SOCis that are the same in number such as three charging SOCis and three discharging SOCis, or, although the second SOC error is reduced not as much, the averaged SOCi can be acquired by using the charging SOCi and the discharging SOCi that are different in number (such as two charging SOCis and three discharging SOCis). The first SOC error can also be reduced by updating the averaged SOCi.

(V) Therefore, as described above, the secondary battery system of the present invention acquires each of the SOCv from the charging CCV at a predetermined charging point during the charging period of the battery pack 110, and the SOCv from the discharging CCV at a predetermined discharging point during the discharging period of the battery pack 110. The system then calculates the charging SOCi on the basis of the charging CCV and the discharging SOCi on the basis of the discharging CCV.

The system further calculates, on the basis of the charging SOCi and the discharging SOCi, a corrected SOC (averaged SOCi) in which a gap SOC error (second SOC error) included in the SOC of the battery pack 110 and resulting from the gap between the CCV and the OCV is reduced.

Furthermore, at a predetermined replacement point, the corrected SOC being calculated replaces the SOC of the battery pack 110 to update the SOC of the battery pack 110, whereby a cumulative SOC error (first SOC error) included in the SOC of the battery pack 110 and resulting from the measurement error of the current value at the time of charging or discharging the battery pack 110 is reduced.

As a result, the first SOC error and the second SOC error included in the SOC of the battery pack 110 can be easily removed to be able to improve the accuracy of the SOC of the battery pack 110.

Second Embodiment

In a second embodiment, there will be described a case where the present invention is applied to a secondary battery system that is mounted in a vehicle system included in a hybrid vehicle (HEV) and a plug-in hybrid vehicle (PHEV). Note that a definition of each of a charging period and a discharging period is similar to that of the first embodiment. Moreover, a part similar to that of the first embodiment will not be described.

As has been described with reference to FIGS. 10(a1) to 10(b2), the present invention cannot be applied when only charging or discharging continues. Accordingly, when only charging or discharging continues in the second embodiment, a reverse charging or discharging operation is forcibly performed. Details will be described below.

Figure 12:
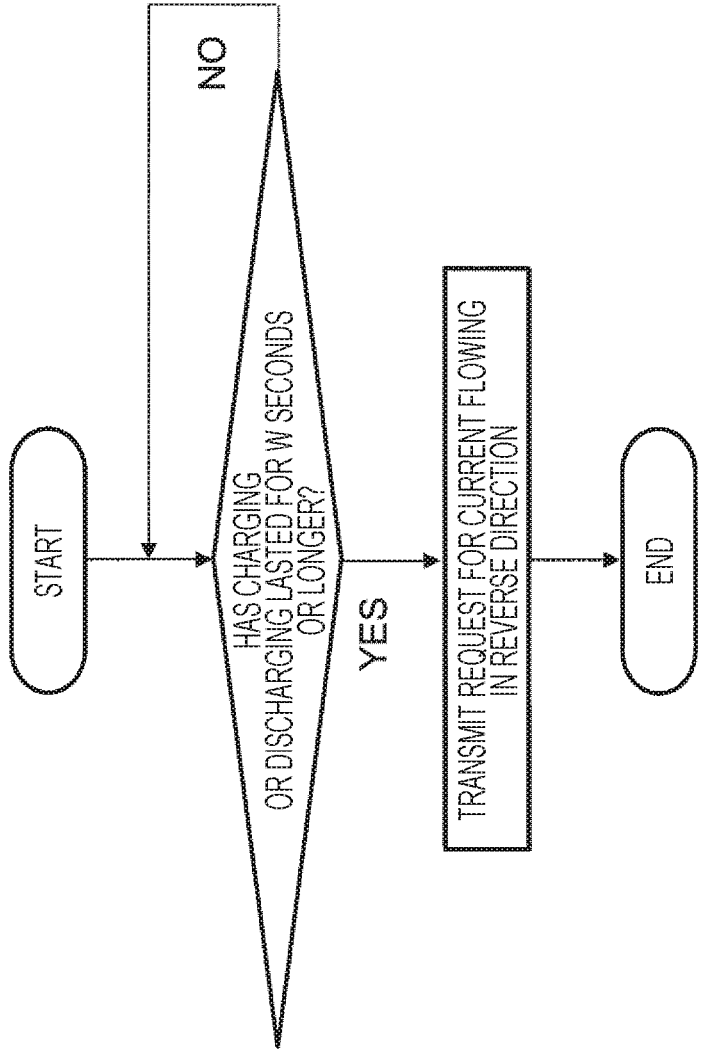
FIG. 12 is a flowchart illustrating a method of charging/discharging the battery according to the present invention.

FIG. 12 illustrates the flow of processing added to a battery pack control unit 150 in the second embodiment. The battery pack control unit 150 of the second embodiment monitors a charging/discharging status of a battery pack 110 formed of a unit cell 111 and transmits, to a vehicle control unit 200, a request for a current flowing in a reverse direction, namely a discharge current when charging continues for a predetermined time W or longer or a charge current when discharging continues for the predetermined time W or longer. Upon receiving the request, the vehicle control unit 200 discharges the battery pack 110 by operating an electric component or the like (not shown) of a vehicle or driving a motor/generator 410 when a discharge request is made, or charges the battery pack 110 by operating a generator or the like such as an alternator (not shown) mounted in the vehicle when a charge request is made.

The battery pack control unit 150 and the vehicle control unit 200 perform the aforementioned operations to be able to mitigate the problem that the present invention cannot be applied to a pattern in which only charging or discharging continues as described above, by using an external component of a secondary battery system 100.

Third Embodiment

In a third embodiment, there will be described a case where the present invention is applied to a secondary battery system that is mounted in a vehicle system included in a hybrid vehicle (HEV), a plug-in hybrid vehicle (PHEV) and an electric vehicle (EV). Note that a definition of each of a charging period and a discharging period is similar to that of the first embodiment. Moreover, a part similar to that of the first embodiment will not be described.

Instead of detecting an SOCv from a CCV, a battery pack control unit 150 of the third embodiment estimates an OCV from the CCV and then detects the SOCv from the estimated OCV.

The OCV can be estimated by using expression (5) and an equivalent circuit model in FIG. 4. Note, however, that battery characteristics such as an internal resistance 114, an impedance 115 and a capacitance 116 need to be extracted from charge/discharge test data of a battery and stored in advance into a storage unit 180 as described above, so that the test data need to be prepared in advance in the present embodiment.

In estimating the OCV, an OCV error occurs due to the influence of an IR drop and Vp not being subtracted completely or being subtracted too much. When the IR drop and Vp cannot be subtracted completely, there occurs the OCV error in a positive direction at the time of charging and the OCV error in a negative direction at the time of discharging. When the IR drop and Vp are subtracted too much, there occurs the OCV error in a negative direction at the time of charging and the OCV error in a positive direction at the time of discharging. This OCV error causes an SOC error in the same direction where, in the present embodiment, the SOCv including the SOC error and resulting from the OCV error is detected at the times of charging and discharging to perform an SOCi computation and averaging. As a result, the SOCi including the SOCv detected at the times of charging and discharging is averaged to be able to cancel out and reduce the SOC error, even when the SOC error occurs due to the influence of the IR drop and Vp not being subtracted completely or being subtracted too much at the times of charging and discharging.

Fourth Embodiment

In a fourth embodiment, there will be described a case where the present invention is applied to a secondary battery system that is mounted in a vehicle system included in a plug-in hybrid vehicle (PHEV) and an electric vehicle (EV). A part similar to that of the first embodiment will not be described.

In the fourth embodiment, an averaged SOCi is acquired by making an SOCi pair with a charging SOCi acquired from a charging period by a charger 420 and a discharging SOCi acquired from a discharging period during which a vehicle travels predominantly outside the charging period.

Here, the charging period and the discharging period of the fourth embodiment will be defined. A period has a beginning and an end.

A beginning and an end of the charging period in the fourth embodiment are as follows.

The beginning of the charging period in the fourth embodiment is a time when a secondary battery system 100 is connected to the charger 420.

The end of the charging period in the fourth embodiment is a time when the secondary battery system 100 is disconnected from the charger 420.

A period delimited by the beginning and the end is the charging period of the fourth embodiment.

The discharging period of the fourth embodiment is a period outside the charging period defined above. That is, The beginning of the discharging period in the fourth embodiment is a time when the secondary battery system 100 is disconnected from the charger 420.

The end of the discharging period in the fourth embodiment is a time when the secondary battery system 100 is connected to the charger 420.

A period delimited by the beginning and the end is the discharging period of the fourth embodiment.

While the charging period and the discharging period are defined as above, a discharging operation such as charging of a battery of auxiliary equipment or discharging that supplies power to an apparatus connected to the interior/exterior of a vehicle may be performed during the charging period or, during the discharging period, a charging operation such as charging by regeneration may be performed. However, as with another embodiment, in this fourth embodiment, the charging operation is dominant during the charging period while the discharging operation is dominant during the discharging period, whereby a second SOC error is thought to occur in a positive direction during the charging period and in a negative direction during the discharging period. Note that it is desired to detect an SOCv from a CCV at a timing when the discharging operation is not performed during the charging period and when the charging operation is not performed during the discharging period, more suitably at a timing when a charge current equals a predetermined threshold or lower during the charging period and when a discharge current equals a predetermined threshold or lower during the discharging period. Note that even when the discharge current flows during the charging period or when the charge current flows during the discharging period, allowed processing can be applied as long as the current falls within a predetermined threshold.

Figure 13A:
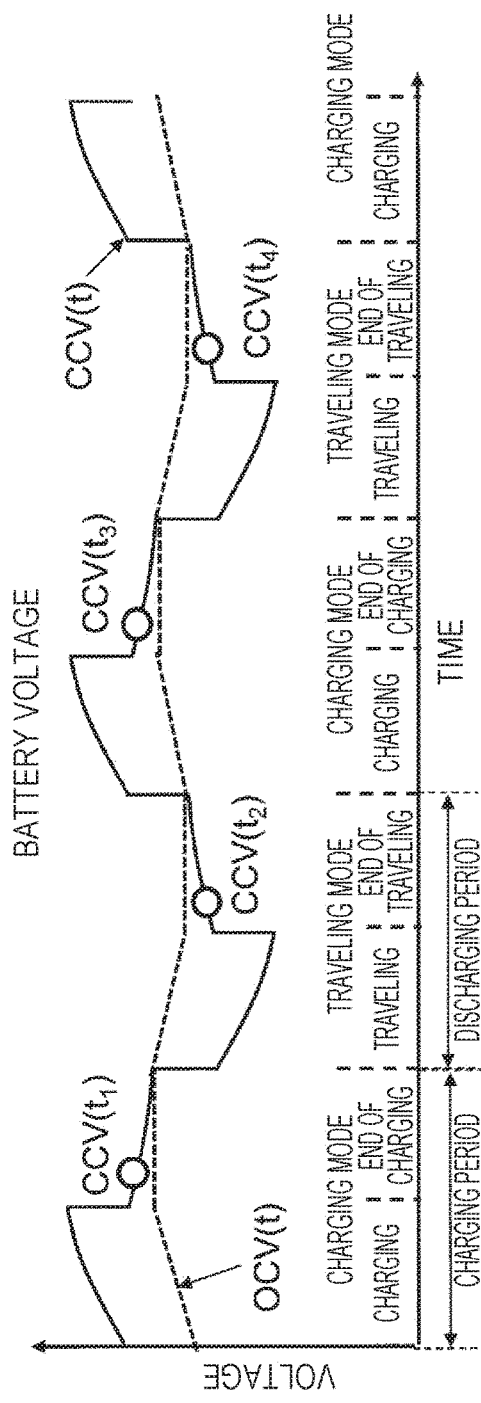
FIGS. 13A and 13B are diagrams illustrating a calculation timing for the SOC computation according to the present invention.
Figure 13B:
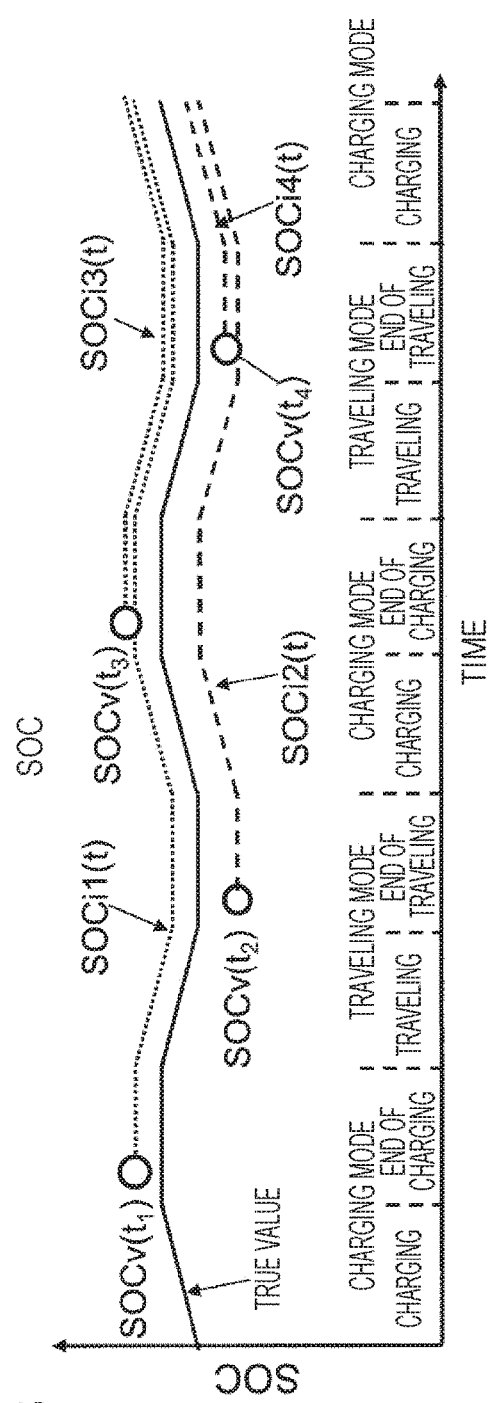

FIGS. 13(a) and 13(b) illustrate a timing at which an SOC computation is performed according to the fourth embodiment. The secondary battery system 100 is in a charging mode when connected to the charger 420, and a period corresponding to the charging mode is the charging period. Likewise, the secondary battery system 100 is in a discharging mode when not connected to the charger 420, and a period corresponding to the discharging mode is the discharging period. A charging SOCi is acquired by detecting the SOCv from the CCV during the charging period when the discharging operation in the charging period is not performed. A discharging SOCi is acquired by detecting the SOCv from the CCV during the discharging period when the charging operation in the discharging period is not performed. Then, the acquired charging SOCi and discharging SOCi are used to make an SOCi pair, which is subjected to averaging processing so that an averaged SOCi is acquired. Note that FIGS. 13(a) and 13(b) illustrate an image that the SOCv is detected from the CCV at a timing when the charge current is small during the charging period such as near or at the end of charging, and a timing when the discharge current is small during the discharging period such as when a vehicle is stopped or stops traveling.

In the fourth embodiment, as has been described, the present invention is applied to the secondary battery system 100 according to the connection status of the charger 420 as a criterion, the secondary battery system being mounted in the vehicle system included in the plug-in hybrid vehicle (PHEV) and the electric vehicle (EV). The averaged SOCi is acquired by making the SOCi pair with the charging SOCi acquired from the charging period by the charger 420 and the discharging SOCi acquired from the discharging period during which a vehicle travels predominantly outside the charging period, whereby the effect similar to that of the first embodiment can be achieved.

Variation for Calculating Averaged SOCi

In the first to fourth embodiments described above, the charging SOCi and the discharging SOCi making up a SOCi pair are calculated and subjected to the averaging processing moment by moment, so that the averaged SOCi is calculated moment by moment. In the following description, the averaged SOCi will be calculated by a method different from that of the first to fourth embodiments.

Whether it is the charging SOCi or the discharging SOCi, the SOCi calculated moment by moment is acquired by obtaining the SOCv according to expression (1) and then adding a time-integrated value of the charge or discharge current to the SOCv. There is a time difference between times at which calculations of the charging SOCi and the discharging SOCi are started, so that temporal integration of the charge or discharge current results in a difference in the time-integrated values by the amount corresponding to the time difference. However, the charging SOCi and the discharging SOCi have the same time-integrated value for the temporal integration performed after the time at which the charging SOCi or the discharging SOCi that comes later therebetween starts to be calculated. The present variation is based on such phenomenon.

The aforementioned example will be specifically described with reference to FIG. 14. Note that since the present invention holds either by calculating the charging SOCi first or by calculating the discharging SOCi first, the SOCi calculated first will be referred to as a first SOCi while the SOCi calculated later will be referred to as a second SOCi in order to simplify the description.

FIG. 14 illustrates a process of calculating the averaged SOCi by performing the averaging processing on the first SOCi and the second SOCi. An increase or decrease in the SOC is not represented in the figure for the sake of simplicity. Time $t_1$ is a time at which the first SOCi is calculated first, namely a time at which the SOCv of the first SOCi is obtained, and time $t_2$ is a time at which the second SOCi is calculated first, namely a time at which the SOCv of the second SOCi is obtained. Moreover, time t is a certain time after time $t_2$. Furthermore, for the sake of simplicity, A indicates the SOCv of the first SOCi, B indicates the SOCv of the second SOCi, C indicates temporal integration $\Delta$SOC (t) of the charge or discharge current from time $t_1$ to time $t_2$, and D indicates temporal integration $\Delta$SOC (t) of the charge or discharge current from time $t_2$ to time t.

According to the aforementioned setting, at time $t_2$, the first SOCi equals A+C, the second SOCi equals B, and the averaged SOCi equals (A+C+B)/2.

At time t after time $t_2$, the first SOCi equals A+C+D while the second SOCi equals B+D. As with time $t_2$, (A+C+D) and (B+D) at time t are subjected to the averaging processing so that the averaged SOCi is acquired as expressed in expression (6).

$$\text{Averaged SOC}i \text{ at time } t=\{(A+C+D)+(B+D)\}/2 \quad (6)$$

$$\text{SOC}i=\{(A+C+D)+(B+D)\}/2 \quad (6)$$

Here, a right side of expression (6) is modified into expression (7) below.

$$\{(A+C+D)+(B+D)\}/2=(A+C+B)/2+D \quad (7)$$

A first term on a right side of expression (7) is the averaged SOCi at time $t_2$, and a second term on the right side of expression (7) is D, or the temporal integration $\Delta$SOC (t) of the charge or discharge current from time $t_2$ to time t. The present variation acquires the averaged SOCi by using the right side of expression (7).

The following can be understood from expression (7). In the first to fourth embodiments, the first SOCi and the second SOCi are subjected to the averaging processing after time $t_2$ in order to acquire the averaged SOCi that changes moment by moment. In the present variation, however, the averaged SOCi is obtained by performing the averaging processing at time $t_2$ so that, from then on, the averaged SOCi at time (t) can be acquired by just adding $\Delta$SOC (t) to the averaged SOCi obtained by the averaging processing at time $t_2$. As a result, according to the present variation, the amount of computation and memory consumption used in the computation can be reduced.

The present variation can be applied in a similar manner to a case where at least one of each of the charging SOCi and the discharging SOCi but not one each is included, such as a case where the averaged SOCi is acquired by performing the averaging processing on one charging SOCi and two discharging SOCis or a case where the averaged SOCi is acquired by performing the averaging processing on three charging SOCis and two discharging SOCis. In such case, $\Delta$SOC (t) may be added to the averaged SOCi at a point at which the SOCv for the SOCi is acquired the latest among the SOCis subjected to the averaging processing, namely a point at which the SOCi computation for the SOCi, the SOCv for which is acquired the latest, is started.

While has been specifically described on the basis of the embodiments, the present invention is not to be limited to the aforementioned embodiments but can be modified in various manners without departing from the gist of the invention.

Moreover, all or a part of each of the aforementioned configuration, function and processing unit can be designed with an integrated circuit or the like to be implemented as hardware, or implemented as software by a processor executing a program that implements each function. The program implementing each function and information such as a table can be stored in a storage such as a memory or a hard disk, an IC card, or a storage medium such as a DVD.

While the battery pack is formed by connecting in series the unit cells being lithium-ion secondary batteries in the aforementioned embodiment, the battery pack may also be formed by connecting parallel-connected unit cells in series or connecting series-connected unit cells in parallel. The parallel connection may possibly cause a difference in the charge or discharge current flowing through each unit cell 111, in which case a value of the charge or discharge current flowing through each unit cell 111 may be detected by changing the number of the current detection unit 130 installed, or an average current flowing through the unit cells 111 may be found to calculate the SOC on the basis of the average current.

While the SOC of the battery is updated by calculating the averaged SOCi at a point a predetermined number of each of the charging SOCi and the discharging SOCi are available and replacing the SOC of the battery up to that point with the averaged SOCi in the aforementioned embodiment, the point of replacing and updating (replacement point) may be any time after the point at which the averaged SOCi is calculated with the predetermined number of each of the charging SOCi and the discharging SOCi being available. Therefore, the calculation of the averaged SOCi with the predetermined number of each of the charging SOCi and the discharging SOCi being available and the replacement do not necessarily have to occur at the same time.

While the present invention is viewed in terms of detecting the SOC of the battery pack 110 in the aforementioned embodiment, the present invention can also be viewed in terms of the unit cell 111 or the unit cell group 112.

REFERENCE SIGNS LIST

100: secondary battery system, 110: battery pack, 111: unit cell, 112, 112a, 112b: unit cell group, 120: unit cell management unit, 121, 121a, 121b: unit cell control unit, 122: voltage detection circuit, 123: control circuit, 124: signal input/output circuit, 125: temperature detection unit, 130: current detection unit, 140: voltage detection unit, 150:

battery pack control unit, 170: insulating element, 180: storage unit, 181: SOC table, 200: vehicle control unit, 300 to 330: relay, 400: inverter, 410: motor/generator, 420: charger, A1 to A4, C1 to C4: charging, B1 to B4, D1 to D4: discharging

The invention claimed is:

1. A secondary battery system comprising:
a closed circuit voltage (CCV) voltage detection circuit which acquires each of a charging CCV at a predetermined charging point during a charging period of a battery and a discharging CCV at a predetermined discharging point during a discharging period of the battery; and
a battery pack control unit configured to:
calculate a charging state of charge (SOC) based on the charging CCV and a discharging SOC based on the discharging CCV;
calculate, based on the charging SOC and the discharging SOC, a corrected SOC having a reduced gap SOC error that is included in an SOC of the battery and results from a gap with an OCV;
replace, at a predetermined replacement point, the SOC of the battery with the corrected SOC, update the SOC of the battery, and reduce a cumulative SOC error included in the SOC of the battery and resulting from a measurement error of a current value;
acquire m (m is an integer of one or more) number of first SOCs based on the charging SOC and a fluctuation component of the SOC acquired based on a current value integrated from the predetermined charging point;
acquire n (n is an integer of one or more) number of second SOCs based on the discharging SOC and a fluctuation component of the SOC acquired based on a current value integrated from the predetermined discharging point; and
compute an averaged SOC as the corrected SOC by performing averaging processing with use of the m number of the first SOCs and the n number of the second SOCs.

2. A secondary battery system comprising:
a closed circuit voltage (CCV) voltage detection circuit which acquires each of a charging CCV at a predetermined charging point during a charging period of a battery and a discharging CCV at a predetermined discharging point during a discharging period of the battery; and
a battery pack control unit configured to:
calculate a charging state of charge (SOC) based on the charging CCV and a discharging SOC based on the discharging CCV;
calculate, based on the charging SOC and the discharging SOC, a corrected SOC having a reduced gap SOC error that is included in an SOC of the battery and results from a gap with an OCV;
replace, at a predetermined replacement point, the SOC of the battery with the corrected SOC, update the SOC of the battery, and reduce a cumulative SOC error included in the SOC of the battery and resulting from a measurement error of a current value;
acquire m (m is an integer of one or more) number of first SOCs based on an estimated charging SOC calculated by estimating an OCV from the charging CCV and a fluctuation component of the SOC acquired based on a current value integrated from the predetermined charging point;
acquire n (n is an integer of one or more) number of second SOCs based on an estimated discharging SOC calculated by estimating an OCV from the discharging CCV and a fluctuation component of the SOC acquired based on a current value integrated from the predetermined discharging point; and
compute an averaged SOC as the corrected SOC by performing averaging processing with use of the m number of the first SOCs and the n number of the second SOCs.

3. The secondary battery system according to claim 1, wherein the predetermined charging point is a timing at which a charge current of a predetermined value or lower is detected after a charge current of a predetermined value or higher lasts for a predetermined time or longer, and the predetermined discharging point is a timing at which a discharge current of a predetermined value or lower is detected after a discharge current of a predetermined value or higher lasts for a predetermined time or longer.

4. The secondary battery system according to claim 1, wherein the predetermined charging point or the predetermined discharging point is a timing at which a charge current or a discharge current of a predetermined value or lower is detected after integrating a charge amount or a discharge amount.

5. The secondary battery system according to claim 1, wherein the battery pack control unit calculates one or more pairs of one of the first SOCs and one of the second SOCs and performs averaging processing on the first SOC and the second SOC.

6. The secondary battery system according to claim 5, wherein the battery pack control unit includes: a storage unit which stores a plurality of pairs of one of the first SOCs and one of the second SOCs and discards an oldest pair when a latest pair is stored; and a computation unit which averages the plurality of pairs of the first SOCs and the second SOCs stored in the storage unit.

7. The secondary battery system according to claim 1, wherein the secondary battery system is mounted in a vehicle system which performs charging control and discharging control of the battery and transmits, to the vehicle system, a command causing the discharging to start when charging lasts for a predetermined time and causing the charging to start when the discharging lasts for a predetermined time.

8. The secondary battery system according to claim 1, wherein the charging period is a period during which a charger is connected while the discharging period is a period during which the charger is not connected, and
the charging CCV is a CCV acquired by the CCV voltage detection circuit at a point when charging by the charger results in a predetermined charge current value or lower while the discharging CCV is a CCV acquired by the CCV voltage detection circuit at a point when a discharge current value equals a predetermined current value or lower after a vehicle starts traveling upon disconnected from the charger.

* * * * *